United States Patent
Farnworth et al.

(10) Patent No.: US 7,759,240 B2
(45) Date of Patent: *Jul. 20, 2010

(54) USE OF PALLADIUM IN IC MANUFACTURING WITH CONDUCTIVE POLYMER BUMP

(75) Inventors: Warren M. Farnworth, Nampa, ID (US); Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/024,712

(22) Filed: Feb. 1, 2008

(65) Prior Publication Data

US 2008/0119038 A1  May 22, 2008

Related U.S. Application Data

(60) Division of application No. 11/145,632, filed on Jun. 6, 2005, now Pat. No. 7,335,988, which is a continuation of application No. 10/430,616, filed on May 5, 2003, now Pat. No. 6,939,744, which is a continuation of application No. 10/116,962, filed on Apr. 5, 2002, now Pat. No. 6,558,979, which is a continuation of application No. 09/645,947, filed on Aug. 25, 2000, now Pat. No. 6,413,862, which is a continuation of application No. 09/227,072, filed on Jan. 5, 1999, now Pat. No. 6,159,769, which is a division of application No. 08/651,816, filed on May 21, 1996, now Pat. No. 5,925,930.

(51) Int. Cl.
   *H01L 21/44* (2006.01)

(52) U.S. Cl. .............................. 438/614; 257/E21.476; 257/E21.508

(58) Field of Classification Search ................. 438/614; 257/E21.476, E21.508
See application file for complete search history.

(56) References Cited

U.S. PATENT DOCUMENTS

| 4,182,781 | A | | 1/1980 | Hooper et al. |
| 4,442,966 | A | | 4/1984 | Jourdain et al. |
| 4,970,571 | A | * | 11/1990 | Yamakawa et al. .......... 257/737 |
| 5,034,345 | A | | 7/1991 | Shirahata |
| 5,048,744 | A | | 9/1991 | Chang et al. |
| 5,196,371 | A | | 3/1993 | Kulesza et al. |
| 5,237,130 | A | | 8/1993 | Kulesza et al. |
| 5,258,577 | A | | 11/1993 | Clements |
| 5,468,681 | A | | 11/1995 | Pasch |
| 5,468,995 | A | | 11/1995 | Higgins, III |
| 5,478,007 | A | | 12/1995 | Marrs |
| 5,485,038 | A | | 1/1996 | Licari et al. |
| 5,486,721 | A | | 1/1996 | Kerklotaz et al. |
| 5,489,804 | A | | 2/1996 | Pasch |

(Continued)

FOREIGN PATENT DOCUMENTS

JP    408045938    2/1996

*Primary Examiner*—Charles D Garber
*Assistant Examiner*—Abdulfattah Mustapha
(74) *Attorney, Agent, or Firm*—TraskBritt

(57) ABSTRACT

An apparatus and a method for forming a substrate having a palladium metal layer over at least one contact point of the substrate and having a flexible conductive polymer bump, preferably a two-stage epoxy, on the palladium plated contact point, are provided. The present invention also relates to assemblies comprising one or more of these substrates.

34 Claims, 5 Drawing Sheets

U.S. PATENT DOCUMENTS

| | | | |
|---|---|---|---|
| 5,491,612 A | 2/1996 | Nicewarner, Jr. | |
| 5,492,863 A | 2/1996 | Higgins, III | |
| 5,493,437 A | 2/1996 | Lebby et al. | |
| 5,508,228 A | 4/1996 | Nolan et al. | |
| 5,521,432 A | 5/1996 | Tsuji et al. | |
| 5,561,320 A | 10/1996 | Abbott et al. | |
| 5,591,941 A | 1/1997 | Acocella et al. | |
| 5,611,140 A | 3/1997 | Kulesza et al. | |
| 5,674,780 A | 10/1997 | Lytle et al. | |
| 5,677,566 A | 10/1997 | King et al. | |
| 5,707,902 A | 1/1998 | Chang et al. | |
| 5,739,053 A | 4/1998 | Kawakita et al. | |
| 5,808,360 A | 9/1998 | Akram | |
| 5,879,761 A | 3/1999 | Kulesza et al. | |
| 5,925,930 A | 7/1999 | Farnworth et al. | |
| 5,940,679 A | 8/1999 | Tomura et al. | |
| 6,072,236 A | 6/2000 | Akram et al. | |
| 6,159,769 A | 12/2000 | Farnworth et al. | |
| 6,249,051 B1 * | 6/2001 | Chang et al. | 257/737 |
| 6,413,862 B1 | 7/2002 | Farnworth et al. | |
| 6,504,105 B1 | 1/2003 | Acocella et al. | |
| 6,558,979 B2 | 5/2003 | Farnworth et al. | |
| 2005/0104210 A1 * | 5/2005 | Farnworth et al. | 257/737 |

* cited by examiner

USE OF PALLADIUM IN IC MANUFACTURING WITH CONDUCTIVE POLYMER BUMP

CROSS-REFERENCE TO RELATED APPLICATIONS

This application is a divisional of application Ser. No. 11/145,632, filed Jun. 6, 2005, now U.S. Pat. 7,335,988, issued Feb. 26, 2008, which is a continuation of application Ser. No. 10/430,616, filed May 5, 2003, now U.S. Pat. 6,939,744, issued Sep. 6, 2005, which is a continuation of application Ser. No. 10/116,962, filed Apr. 5, 2002, now U.S. Pat. 6,558,979, issued May 6, 2003, which is a continuation of application Ser. No. 09/645,947, filed Aug. 25, 2000, now U.S. Pat. 6,413,862, issued Jul. 2, 2002, which is a continuation of application Ser. No. 09/227,072, filed Jan. 5, 1999, now U.S. Pat. 6,159,769, issued Dec. 12, 2000, which is a divisional of application Ser. No. 08/651,816, filed May 21, 1996, now U.S. Pat. 5,925,930, issued Jul. 20, 1999.

BACKGROUND OF THE INVENTION

1. Field of the Invention

The present invention relates to an apparatus and a method for forming a conductive polymer bump on a substrate, such as a flip-chip type semiconductor die, a silicon wafer, a printed circuit board, or other substrate (hereinafter referred to generally as a "substrate"). More particularly, the present invention relates to forming a substrate having a palladium metal layer over each contact point of the substrate and forming a flexible conductive polymer bump on each contact point. The present invention also relates to assemblies and methods of connecting one or more of these substrates together or to another substrate.

2. State of the Art

A flip-chip is a semiconductor chip or die that has bumped terminations spaced around an active surface of the die and is intended for face-to-face attachment to a substrate or another semiconductor die. The bumped terminations of the flip-chips are usually a "Ball Grid Array" ("BGA") configuration wherein an array of minute solder balls is disposed on an attachment surface of a semiconductor die, or a "Slightly Larger than Integrated Circuit Carrier" ("SLICC") configuration wherein an array of minute solder balls is disposed on an attachment surface of a semiconductor die similar to a BGA, but having a smaller solder ball pitch and diameter than a BGA.

The attachment of a flip-chip to a substrate or mother semiconductor involves aligning the solder balls on the flip-chip with a plurality of contact points (configured to be a mirror image of the solder ball arrangement on the flip-chip) on the facing surface of the substrate. A plurality of solder balls may also be formed on the facing surface of the substrate at the contact points. A quantity of liquid flux is often applied to the face of the chip and/or substrate, and the chip and substrate are subjected to elevated temperatures to effect reflowing or soldering of the solder balls on the chip and/or corresponding solder balls on the substrate. This connection technology is also referred to as "flip-chip attachment" or "C4 Controlled Collapse Chip Connection."

High performance microelectronic devices generally comprise a number of flip-chips attached to a substrate or printed circuit board ("PCB") for electrical interconnection to other microelectronic devices. For example, a very large scale integration ("VLSI") chip may be electrically connected to a substrate, printed circuit board, or other next level packaging substrate.

Flip-chip attachment requires the formation of contact terminals on flip-chip contact sites, each consisting of a metal pad with a solder ball disposed thereon. Flip-chip attachment also requires the formation of solder joinable sites ("bond pads") on the metal conductors of the substrate or PCB which are a mirror-image of the solder ball arrangement on the flip-chip. The bond pads on the substrate are usually surrounded by non-solderable barriers so that when the solder of the bond pads and of the chip contact sites melts and merges ("reflow"), the surface tension holds the semiconductor chip by solder columns, as if suspended above the substrate. After cooling, the chip is essentially welded face-down by these very small, closely spaced solder column interconnections.

It is also known in the art that conductive polymers or resins can be utilized in lieu of solder balls. U.S. Pat. 5,258,577 issued Nov. 2, 1993 to Clements relates to a substrate and a semiconductor die with a discontinuous passivation layer. The discontinuities result in vias between the contact points of the substrate and the semiconductor die. A resin with spaced conductive metal particles suspended therein is disposed within the vias to achieve electrical contact between the substrate and the semiconductor die. U.S. Pat. 5,468,681 issued Nov. 21, 1995 to Pasch relates to interconnecting conductive substrates using an interposer having conductive plastic filled vias. U.S. Pat. 5,478,007 issued Dec. 26, 1995 to Marrs relates to using conductive epoxy as a bond pad structure on a substrate for receiving a coined ball bond on a die to achieve electrical communication between the die and the substrate.

Such flip-chip and substrate attachments (collectively "electronic packages") are generally comprised of dissimilar materials that expand at different rates on heating. The most severe stress is due to the inherently large thermal coefficient of expansion ("TCE") mismatch between the plastic and the metal. These electronic packages are subject to two types of heat exposures: process cycles, which are often high in temperature but few in number; and operation cycles, which are numerous but less extreme. If either the flip-chip(s) or substrate(s) are unable to repeatedly bear their share of the system thermal mismatch, the electronic package will fracture, which destroys the functionality of the electronic package.

As an electronic package dissipates heat to its surroundings during operation, or as the ambient system temperature changes, differential thermal expansions cause stresses to be generated in the interconnection structures (e.g., solder ball bonds) between the semiconductor die and the substrate. These stresses produce instantaneous elastic and, most often, plastic strain, as well as time-dependent (plastic and anelastic) strains in the joint, especially within its weakest segment. Thus, the TCE mismatch between chip and substrate will cause a shear displacement to be applied on each terminal which can fracture the solder connection.

The problem with TCE mismatch becomes evident during the process of burn-in. Burn-in is the process of electrically stressing a device, usually at an elevated temperature and voltage environment, for an adequate period of time to cause failure of marginal devices. When a chip, such as a flip-chip, breaks free from the substrate due to TCE mismatch, defective bonds, or the like, the chip must be reattached and the burn-in process reinitiated. This requires considerable time and effort which results in increased production costs. Alternately, if the chip has been underfilled and subsequently breaks free during burn-in, the chip is not reworkable and must be discarded.

The problems with TCE mismatch are also applicable to connections made with conductive polymers or resins, because after curing the polymers or resins become substantially rigid. The rigid connections are equally susceptible to breakage due to TCE mismatch.

FIGS. 1-1e show a contemporary, prior art method of forming a conductive bump arrangement on a substrate. First, as shown in FIG. 1a, a passivation film 102, such as at least one layer of SiO$_2$ film, Si$_3$N$_4$ film, or the like, is formed over a face surface 104 of a semiconductor wafer 100 which has a conductive electrode 106, usually an aluminum electrode. The passivation film 102 is selectively etched to expose the conductive electrode 106. FIG. 1b shows a metal layer 108 applied over a face surface 110 of the passivation film 102 by deposition or sputtering. A second layer of etch resist film 112 is applied to a face surface 114 of the metal layer 108. The second layer of etch resist film 112 is masked, exposed, and stripped to expose a portion of the metal layer 108 corresponding to the conductive electrode 106, as shown in FIG. 1c. A solder bump 116 (generally an alloy of lead and tin) is then formed on the exposed portion of the metal layer 108, as shown in FIG. 1d, by any known industry technique, such as stenciling, screen printing, electroplating, electrolysis, or the like. The second layer of etch resist film 112 is removed and the metal layer 108 is removed using the solder bump 116 as a mask to form the structure shown in FIG. 1e. This conventional bump formation method has drawbacks. The most obvious being the large number of process steps required which results in high manufacturing costs.

U.S. Pat. 4,970,571 issued Nov. 13, 1990 to Yamakawa et al. (the '571 patent) relates to a bump formation method which addresses the problems associated with conventional processing methods by using electroless plating of palladium on the conductive electrodes. Electroless plating is a metal deposition process, usually in an aqueous medium, occurring through an exchange reaction between metal complexes in solution and the particular metal to be coated which does not require externally applied electric current. The process of electroless plating of palladium generally comprises dipping the semiconductor element with the exposed conductive electrodes into a palladium solution wherein the palladium selectively bonds or plates on the conductive electrodes. The electroless plating process is a non-vacuum, high volume, high throughput process which can be precisely controlled and uses reliable equipment. The entire fabrication can be performed in a less costly cleanroom environment which reduces processing time and cost. The '571 patent teaches forming an electroless palladium plated conductive electrode followed by the formation of a metal bump on the palladium plated conductive electrode.

The benefits of using palladium in integrated circuits are discussed in U.S. Pat. No. 4,182,781 issued Jan. 8, 1980, to Hooper et al. (the '781 patent). The '781 patent teaches that palladium forms a unique barrier metal in bump metallization systems which increases yield and reliability of integrated circuit devices designed for flip-chip attachment. It is also disclosed that palladium is compatible with aluminum and has a thermal coefficient of expansion that is sufficiently close to aluminum so that no significant stress problems result. However, the '781 patent does not teach using an electroless plating process to coat the conductive electrode with palladium. However, electroless plating is used to form the copper or nickel bump on the palladium coated conductive electrode.

It would be advantageous to develop a more efficient technique for forming conductive bumps on a flip-chip which eliminates some of the steps required by present industry standard techniques while also abating the effects of TCE mismatch using commercially available, widely practiced semiconductor device fabrication techniques.

BRIEF SUMMARY OF THE INVENTION

The present invention relates to an apparatus and a method for forming a substrate having a palladium metal layer over at least one contact point of the substrate and having a flexible conductive polymer bump, preferably a two-stage epoxy, on the palladium plated contact point. The apparatus and method of the present invention abate the effects of TCE mismatch and reduce the number of steps required to produce substrates. The present invention also relates to assemblies comprising one or more of these substrates.

A preferred method for constructing the apparatus of the present invention comprises providing a substrate, for example a semiconductor wafer, which has at least one conductive electrode, a semiconductor chip which has at least one bond pad, or a printed circuit board. A passivation film such as at least one layer of SiO$_2$ film, Si$_3$N$_4$ film, or the like is formed over a face surface of the substrate. The passivation film is selectively etched to expose each conductive electrode or bond pad. The substrate is then submersed in an electroless plating bath containing palladium in solution. The palladium, through an exchange reaction with the exposed conductive electrodes, bonds to an upper surface of the conductive electrode or bond pad thereby plating the conductive electrode or bond pad with a layer of palladium.

It is, of course, understood that the passivation layer may not be necessary when the material surrounding the conductive electrode or bond pad is inert or is not otherwise susceptible to being plated during the electroless plating process.

A conductive polymer is preferably applied to an upper surface of the palladium layers to form a conductive polymer bump. The conductive polymer bump is preferably a two-stage epoxy which does not completely set, typically referred to as a "B-stage" type epoxy. For example, a preferred two-stage epoxy such as RSC 3927-W/-B stage conductor, available from IMR Corporation, Nampa, Id., can be used. The conductive polymer used to form the conductive bump usually has a high electrical conductivity metal, such as palladium, gold, silver, or the like, dispersed therein to impart electrical conductivity to the polymer.

The conductive polymer bump can be formed by any number of known industry standard techniques; however, the preferred method comprises stencil printing the conductive polymer onto the conductive electrode. The stencil printing process can be performed in one step or in multiple printing steps wherein a plurality of layers of conductive polymer is applied in succession. The stencil printing method for forming the conductive polymer bumps of the present invention is advantageous over presently known fabrication methods, since it is a simpler process (having fewer processing steps) and is less expensive.

A semiconductor assembly may be fabricated by attaching substrates together in a face-to-face flip-chip arrangement. The substrates are mechanically attached to and in electrical communication with one another via the plurality of conductive polymer bumps formed on the palladium metal layers of the first substrate, the palladium metal layers of the second substrate, or both. An under-fill encapsulant may be disposed between the first substrate and the second substrate for environmental protection and to enhance the attachment of the first substrate and the second substrate.

The use of a two-step curing epoxy virtually eliminates the problems associated with TCE mismatch. Since the two-step curing epoxy never completely sets to form a rigid matrix, the connections will have an amount of "give" or "flex" during the thermal expansion and contraction of the substrates, while still making a reliable substrate-to-substrate electrical connection. This, in turn, reduces the failure rate of semiconductor assemblies during burn-in and during general use.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1A:
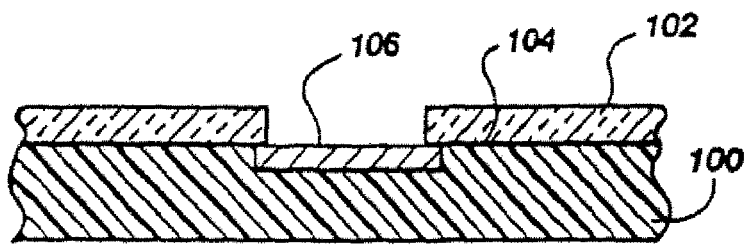
FIGS. 1a-1e illustrate side cross-sectional views of a prior art method of forming a conductive bump on a substrate.
Figure 1B:
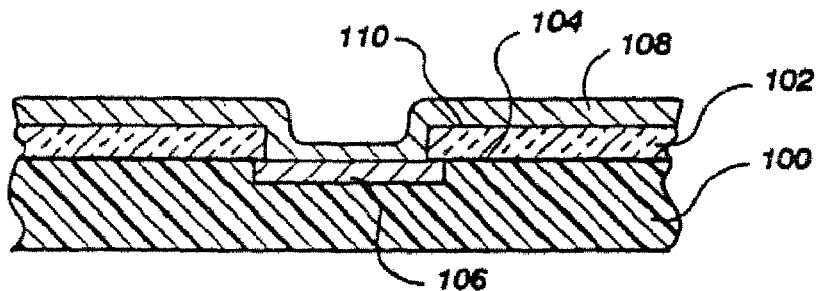
Figure 1C:
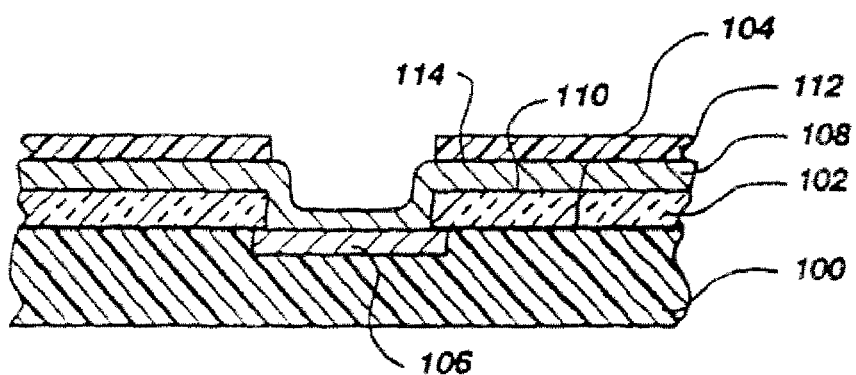
Figure 1D:
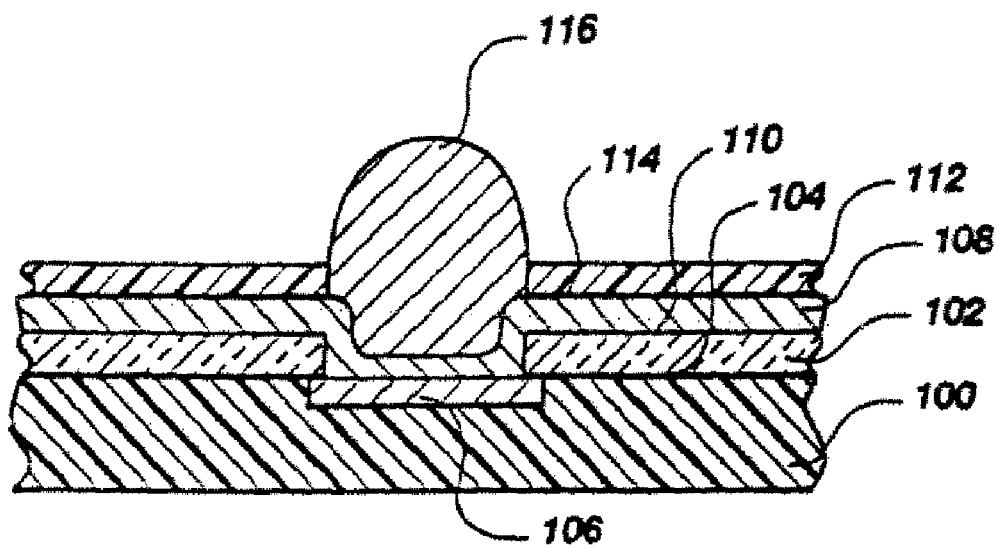
Figure 1E:
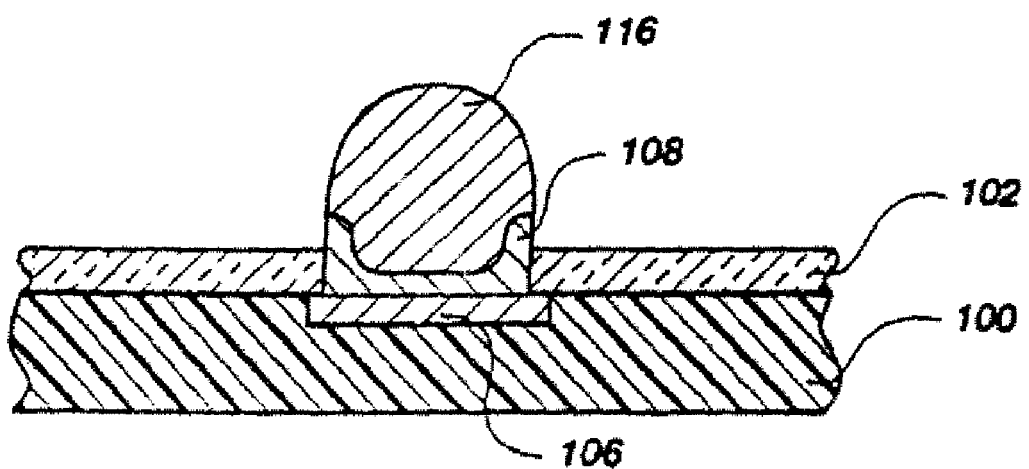
Figure 2A:
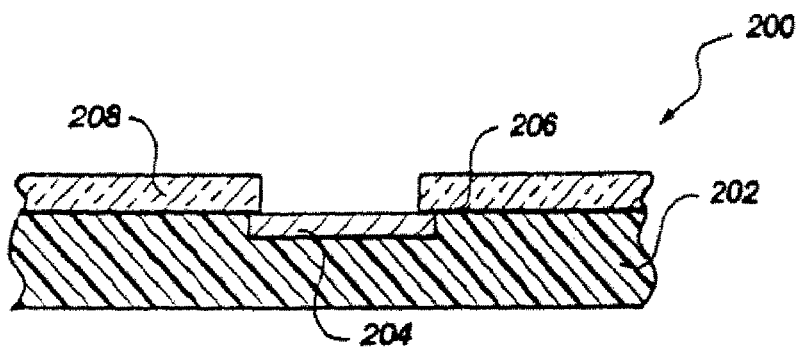
FIGS. 2a-2c illustrate side cross-sectional views of the steps of a method of forming a conductive polymer bump on a substrate of the present invention.
Figure 2B:
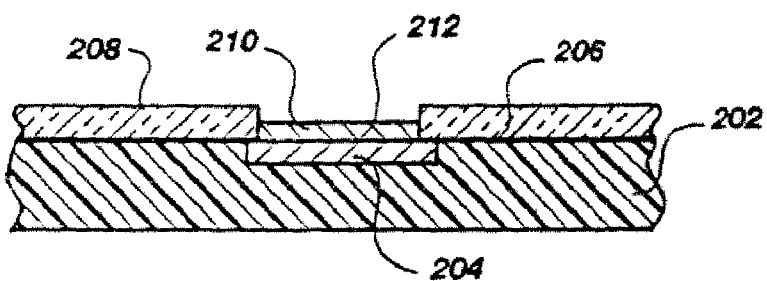
Figure 2C:
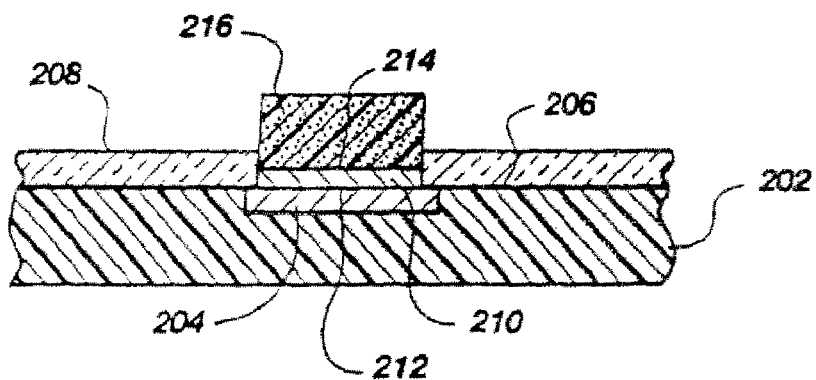

FIGS. 2a-2c illustrate a method of forming a conductive polymer bump on a substrate, such as a silicon wafer, a printed circuit board, or the like, of the present invention. FIG. 2a illustrates an exposed electrode substrate assembly 200 comprising a substrate 202 which has at least one conductive electrode 204, usually aluminum electrodes, disposed thereon. A passivation film 208 may be formed over a face surface 206 of the substrate 202. The passivation film 208 is selectively etched to expose the conductive electrode 204.

The exposed electrode substrate assembly 200 is immersed in an electroless plating bath containing palladium in solution, whereby through an exchange reaction the exposed conductive electrodes 204 are selectively plated with a palladium layer 210 atop an upper surface 212 of the conductive electrode 204, as shown in FIG. 2b. As shown in FIG. 2c, a conductive polymer is applied to an upper surface 214 of the palladium layer 210 to form a conductive polymer bump 216. The conductive polymer bump 216 preferably comprises a two-stage epoxy which does not completely set. The conductive polymer used to form the conductive polymer bump 216 preferably has a high electrical conductivity metal, such as palladium, gold, silver, or the like, dispersed therein. The conductive polymer bump 216 is preferably formed by stencil printing or stenciling the conductive polymer onto the conductive electrode 204.

It is, of course, understood that the passivation film 208 may be stripped from the substrate 202.

Figure 3A:
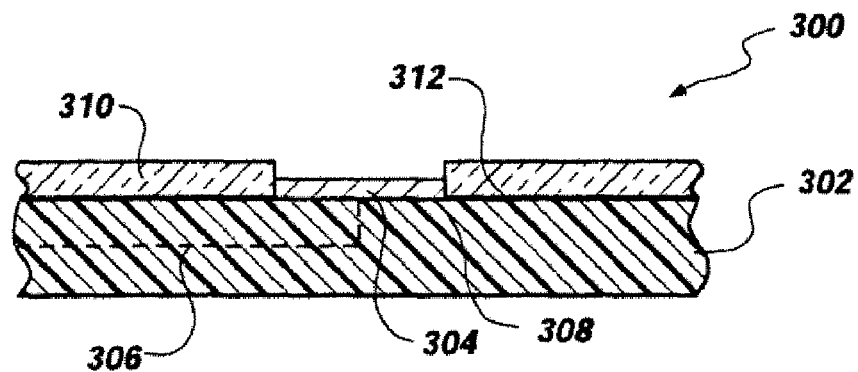
FIGS. 3a-3c illustrate side cross-sectional views of the steps of a method of forming a conductive polymer bump on a semiconductor die of the present invention.
Figure 3B:
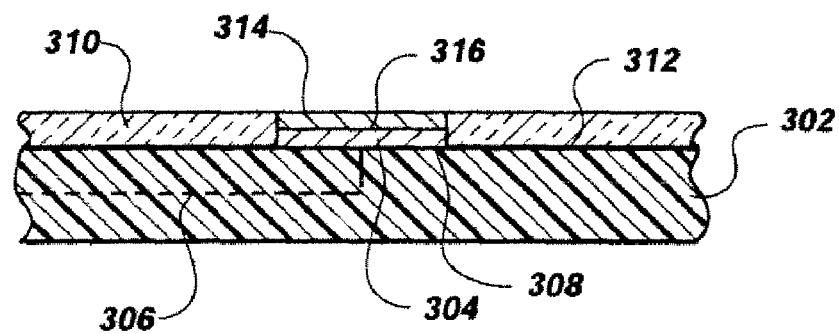
Figure 3C:
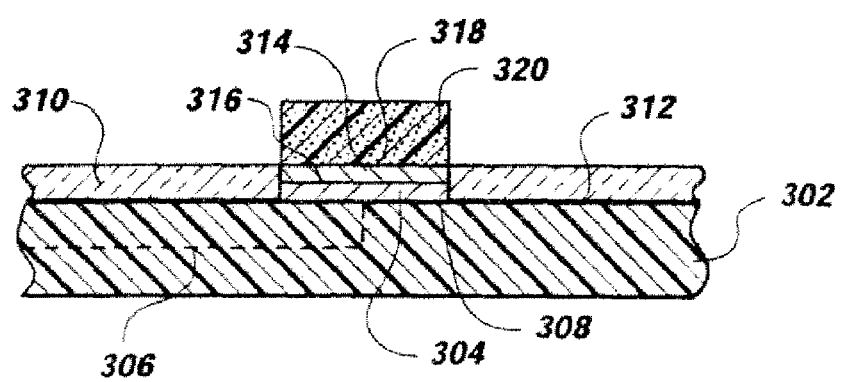

FIGS. 3a-3c illustrate a method of forming a conductive polymer bump on a printed circuit board of the present invention. FIG. 3a illustrates an exposed bond pad chip assembly 300 comprising a printed circuit board 302 which has at least one bond pad 304, usually copper pads, disposed thereon. The bond pad 304 has a lead 306 (shown in shadow) within the printed circuit board 302 attached to a lower surface 308 of the bond pad 304. Optionally, a passivation film 310 such as at least one layer of resist polyimide film, or the like, is formed over a face surface 312 of the printed circuit board 302. The passivation film 310 is selectively etched to expose the bond pad 304.

The exposed bond pad chip assembly 300 is immersed in an electroless plating bath containing palladium in solution, whereby through an exchange reaction the exposed bond pads 304 are selectively plated with a palladium layer 314 atop an upper surface 316 of the bond pad 304, as shown in FIG. 3b. As shown in FIG. 3c, a conductive polymer is applied to an upper surface 318 of the palladium layer 314 to form a conductive polymer bump 320. The conductive polymer bump 320 preferably comprises a two-stage epoxy which does not completely set. The conductive polymer used to form the conductive polymer bump 320 preferably has a metal, such as palladium, gold, silver, or the like, dispersed therein. The conductive polymer bump 320 can be formed in a manner discussed for the conductive polymer bump 216 of FIG. 2.

It is of course, understood that the passivation film 310 may be stripped from the printed circuit board 302.

Figure 4:
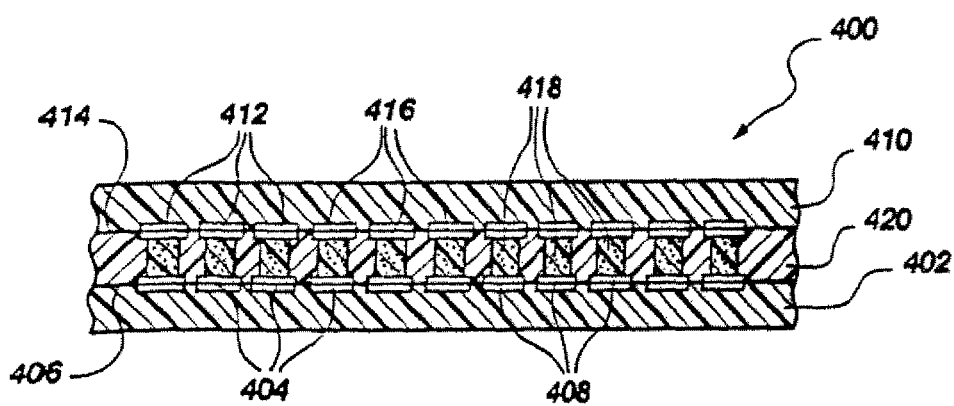
FIG. 4 is a side cross-sectional view of a substrate assembly of the present invention.

FIG. 4 illustrates a substrate assembly 400 of the present invention. The substrate assembly 400 comprises a first substrate 402 with a plurality of conductive electrodes 404 disposed on a facing surface 406 of the first substrate 402. A palladium metal layer 408 is disposed on each conductive electrode 404 by electroless plating. The substrate assembly 400 further comprises a second substrate 410 with a plurality of bond pads 412 disposed on a facing surface 414 of the second substrate 410. A palladium metal layer 416 is also disposed on each bond pad 412. The first substrate 402 and the second substrate 410 are mechanically attached to and in electrical communication with one another via a plurality of conductive polymer bumps 418 extending between the first substrate 402 palladium metal layers 408 and the second substrate 410 palladium metal layers 416. An under-fill encapsulant 420 may be disposed between the first substrate 402 and the second substrate 410 for environmental protection and to enhance the attachment of the first substrate 402 and the second substrate 410.

Figure 5:
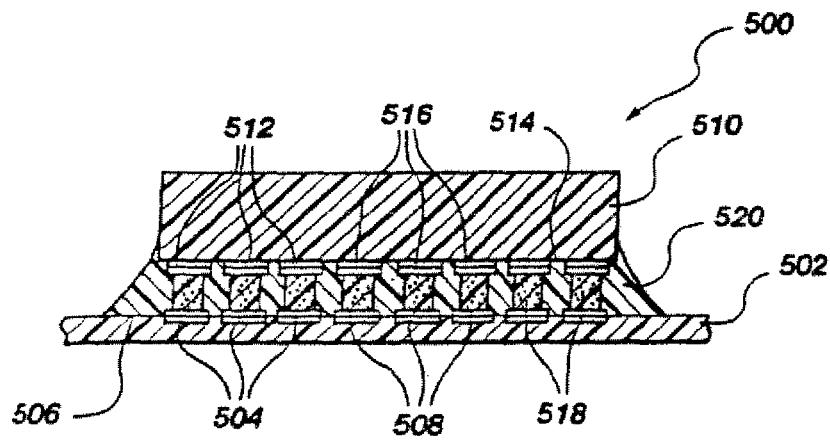
FIG. 5 is a side cross-sectional view of a first embodiment of a substrate/chip assembly of the present invention.

FIG. 5 illustrates a first embodiment of a substrate/chip assembly 500 of the present invention. The substrate/chip assembly 500 comprises a substrate 502 with a plurality of conductive electrodes 504 disposed on a facing surface 506 of the substrate 502. A palladium metal layer 508 is disposed on each conductive electrode 504 by electroless plating. The substrate/chip assembly 500 further comprises a semiconductor chip 510 with a plurality of bond pads 512 disposed on a facing surface 514 of the semiconductor chip 510. A palladium metal layer 516 is also disposed on each bond pad 512. The substrate 502 and the semiconductor chip 510 are mechanically attached to and in electrical communication with one another via a plurality of conductive polymer bumps 518 extending between the substrate 502 palladium metal layers 508 and the semiconductor chip 510 palladium metal layers 516. An under-fill encapsulant 520 may be disposed between the substrate 502 and the semiconductor chip 510 for environmental protection and to enhance the attachment of the substrate 502 and the semiconductor chip 510.

Figure 6:
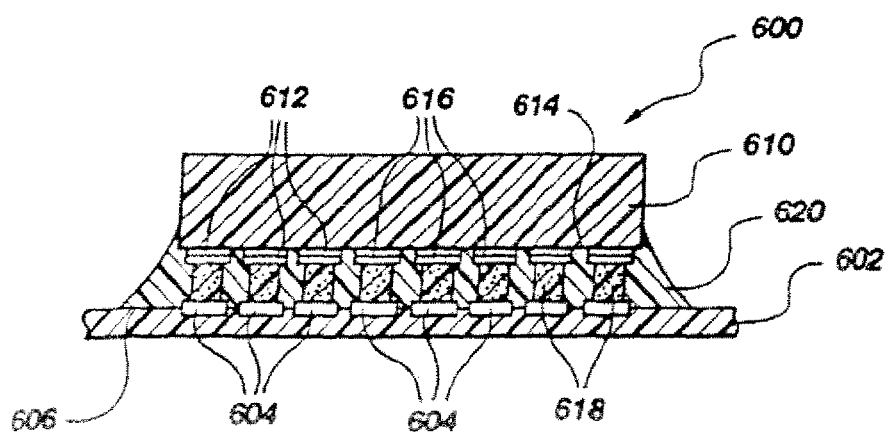
FIG. 6 is a side cross-sectional view of a second embodiment of a substrate/chip assembly of the present invention.

FIG. 6 illustrates a second embodiment of a substrate/chip assembly 600 of the present invention. The substrate/chip assembly 600 comprises a substrate 602 with a plurality of conductive electrodes 604 disposed on a facing surface 606 of the substrate 602. The conductive electrodes 604 may comprise any suitable type metal electrode, such as aluminum. The substrate/chip assembly 600 further comprises a semiconductor chip 610 with a plurality of bond pads 612 disposed on a facing surface 614 of the semiconductor chip 610. A palladium metal layer 616 is also disposed on each bond pad 612. The substrate 602 and the semiconductor chip 610 are mechanically attached to and in electrical communication with one another via a plurality of conductive polymer bumps 618 extending between the substrate 602 conductive electrodes 604 and the semiconductor chip 610 palladium metal layers 616. The conductive material in the conductive polymer bumps 618 is capable of making electrical contact with the conductive electrodes 604 and penetrating any coating thereon whether an oxide coating or a passivation layer coating. An under-fill encapsulant 620 may be disposed between the substrate 602 and the semiconductor chip 610 for environmental protection and to enhance the attachment of the substrate 602 and the semiconductor chip 610.

It is, of course, understood that, although the assemblies shown in FIGS. 4, 5 and 6 show substrates and/or semiconductor chips which use the palladium layered structures of the present invention, one of the substrates and/or semiconductor chips could be one of industry standard manufacture.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method for connecting two substrates, each substrate having at least one conductive electrode, comprising:
   applying a layer of palladium on a portion of the at least one conductive electrode of one of the two substrates; and
   disposing a two-stage flexible epoxy conductive polymer bump between a portion of the at least one conductive electrode having the palladium layer thereon of the one substrate of the two substrates and a portion of the at least one conductive electrode of another substrate of the two substrates for forming an electrical connection therebetween.

2. The method of claim 1, further comprising:
   applying a passivation layer over a portion of a surface of one substrate of the two substrates having the at least one conductive electrode for etching a portion of the passivation layer to expose a portion of the at least one conductive electrode.

3. The method of claim 1, wherein the applying the layer of palladium on a portion of the at least one conductive electrode of the one substrate comprises:
   immersing the one substrate in an electroless plating solution including palladium dispersed therein.

4. The method of claim 1, wherein the disposing a two-stage flexible epoxy conductive polymer bump comprises applying one or more layers of a two-stage flexible epoxy polymer with a silk screen to form the two-stage flexible epoxy conductive polymer bump.

5. The method of claim 1, wherein the one substrate of the two substrates comprises one of a silicon wafer, a printed circuit board, and a semiconductor die.

6. A method for connecting substrates, each substrate having at least one conductive electrode connected to a circuit thereon, comprising:
   applying a layer of palladium on a portion of the at least one conductive electrode of one substrate of the substrates; and
   disposing a two-stage conductive not completely set epoxy polymer bump between a portion of the at least one conductive electrode having the palladium layer thereon of the one substrate of the substrates and a portion of the at least one conductive electrode of another substrate of the substrates for forming an electrical connection therebetween.

7. The method of claim 6, wherein the two-stage conductive polymer bump includes a two-stage epoxy polymer bump having one of palladium, gold, and silver therein.

8. The method of claim 6, further comprising:
   applying a passivation layer over a portion of a surface of one substrate of the substrates having the at least one conductive electrode for etching a portion of the passivation layer to expose a portion of the at least one conductive electrode.

9. The method of claim 6, wherein the applying the layer of palladium on a portion of the at least one conductive electrode of the one substrate comprises:
   immersing the one substrate in an electroless plating solution including palladium dispersed therein.

10. The method of claim 6, wherein the disposing a two-stage conductive polymer bump comprises applying one or more layers of a polymer with a silk screen to form the two-stage conductive polymer bump.

11. The method of claim 6, wherein the one substrate of the substrates comprises one of a silicon wafer, a printed circuit board, and a semiconductor die.

12. An attachment method for substrates, each substrate having at least one conductive electrode thereon, comprising:
   applying a layer of palladium on a portion of the at least one conductive electrode of one substrate of the substrates; and
   placing a layered two-stage conductive B-stage epoxy polymer bump between a portion of the at least one conductive electrode having the palladium layer thereon of the one substrate of the substrates and a portion of the at least one conductive electrode of another substrate of the substrates for forming an electrical connection therebetween.

13. The method of claim 12, wherein the two-stage conductive B-stage epoxy polymer bump includes palladium in a two-stage B-stage epoxy polymer bump.

14. The method of claim 12, further comprising:
   forming a passivation layer over a portion of a surface of one substrate of the substrates having the at least one conductive electrode for etching a portion of the passivation layer to expose a portion of the at least one conductive electrode.

15. The method of claim 12, wherein the applying the layer of palladium on a portion of the at least one conductive electrode of the one substrate comprises:
   contacting the one substrate with an electroless plating solution including palladium dispersed therein.

16. The method of claim 12, wherein the placing a two-stage conductive B-stage epoxy polymer bump comprises applying one or more layers of a polymer with a silk screen to form the two-stage conductive B-stage epoxy polymer bump.

17. The method of claim 12, wherein the one substrate of the substrates comprises one of a silicon wafer, a printed circuit board, and a semiconductor die.

18. A method for joining substrates, each substrate having at least one conductive electrode thereon, comprising:
   forming a layer of palladium on a portion of the at least one conductive electrode of one substrate of the substrates; and
   attaching the substrate to another substrate by applying a two-stage curing conductive epoxy polymer bump that never completely sets to form a rigid matrix between a portion of the at least one conductive electrode having the palladium layer thereon of the one substrate of the substrates and a portion of the at least one conductive electrode of the other substrate of the substrates for forming an electrical connection therebetween.

19. The method of claim 18, wherein the two-stage conductive polymer bump includes palladium in a two-stage epoxy bump.

20. The method of claim 18, further comprising:
forming a passivation layer over a portion of a surface of one substrate of the substrates having the at least one conductive electrode for etching a portion of the passivation layer to expose a portion of the at least one conductive electrode.

21. The method of claim 18, wherein the forming the layer of palladium on a portion of the at least one conductive electrode of the one substrate comprises:
contacting the one substrate with an electroless plating solution including palladium dispersed therein.

22. The method of claim 18, wherein the applying a two-stage conductive polymer bump comprises applying one or more layers of a polymer with a silk screen to form the two-stage conductive polymer bump.

23. The method of claim 18, wherein the one substrate of the substrates comprises one of a silicon wafer, a printed circuit board, and a semiconductor die.

24. A method for assembling substrates, each substrate having at least one conductive electrode thereon, comprising:
disposing a layer of palladium on a portion of the at least one conductive electrode of one substrate of the substrates; and
joining the substrate to another substrate applying a two-stage conductive flexible epoxy polymer bump between a portion of the at least one conductive electrode having the palladium layer thereon of the one substrate of the substrates and a portion of the at least one conductive electrode of another substrate of the substrates for forming an electrical connection therebetween.

25. The method of claim 24, wherein the two-stage conductive flexible epoxy polymer bump includes palladium in a two-stage flexible epoxy polymer bump.

26. The method of claim 24, further comprising:
forming a passivation layer over a portion of a surface of one substrate of the substrates having the at least one conductive electrode for etching a portion of the passivation layer to expose a portion of the at least one conductive electrode.

27. The method of claim 24, wherein the disposing the layer of palladium on a portion of the at least one conductive electrode of the one substrate comprises:
contacting the one substrate with an electroless plating solution including palladium dispersed therein.

28. The method of claim 24, wherein the applying a two-stage conductive flexible epoxy polymer bump comprises applying one or more layers of a polymer with a silk screen to form the two-stage conductive flexible epoxy polymer bump.

29. The method of claim 24, wherein the one substrate of the substrates comprises one of a silicon wafer, a printed circuit board, and a semiconductor die.

30. A method for assembling substrates, each substrate having at least one conductive electrode thereon, comprising:
applying a passivation layer of a portion of a surface of one substrate;
disposing a layer of palladium on a portion of the at least one conductive electrode of one substrate of the substrates; and
securing the substrate to another substrate by applying a two-stage conductive flexible polymer bump that never completely sets to form a rigid matrix between a portion of the at least one conductive electrode having the palladium layer thereon of the one substrate of the substrates and a portion of the at least one conductive electrode of another substrate of the substrates for forming an electrical connection therebetween.

31. The method of claim 30, wherein the two-stage conductive polymer bump includes palladium in a two-stage epoxy bump.

32. The method of claim 30, wherein the applying a passivation layer over a portion of a surface of one substrate comprises applying at least one layer of one of a $SiO_2$ film and a $Si_3N_4$ film to the surface of one substrate.

33. The method of claim 30, wherein the disposing the layer of palladium on a portion of the at least one conductive electrode of the one substrate comprises:
contacting the one substrate with an electroless plating solution including palladium dispersed therein.

34. The method of claim 30, wherein the applying a two-stage conductive polymer bump comprises applying one or more layers of a polymer with a silk screen to form the two-stage conductive polymer bump.

* * * * *